United States Patent
Rettig et al.

(10) Patent No.: US 6,232,764 B1
(45) Date of Patent: *May 15, 2001

(54) ACCESSORY WITH INTERNAL ADJUSTMENTS CONTROLLED BY HOST

(75) Inventors: John B. Rettig, Portland; David H. Olson, Hillsboro; Marvin E. LaVoie, Beaverton; Clifford E. Baker, Hillsboro; Philip K. Jansen, Portland; Ray Zandonatti, Keizer, all of OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,566

(22) Filed: Jun. 12, 1998

(51) Int. Cl.[7] ............................ G01R 31/02; G01R 1/38; G01R 13/00

(52) U.S. Cl. ........................... 324/115; 324/72.5; 702/66

(58) Field of Search ................ 324/121 R, 115, 324/537, 754, 601, 609, 611, 72.5; 702/66, 76

(56) References Cited

U.S. PATENT DOCUMENTS

| | | |
|---|---|---|
| 4,303,984 | 12/1981 | Houvig . |
| 4,313,509 | 2/1982 | Engels . |
| 4,418,392 | 11/1983 | Hata . |
| 4,423,408 | 12/1983 | Place . |
| 4,592,002 | 5/1986 | Bozarth, Jr. et al. . |
| 4,611,304 | 9/1986 | Butenko et al. . |
| 4,672,306 | 6/1987 | Thong . |
| 4,743,844 | * 5/1988 | Odenheimer et al. ........... 324/121 R |
| 4,833,400 | * 5/1989 | Boutigny .............................. 324/126 |
| 4,840,066 | 6/1989 | Botsco et al. . |
| 4,845,649 | 7/1989 | Eckardt et al. . |
| 4,858,615 | 8/1989 | Meinema . |
| 4,868,476 | 9/1989 | Respaut . |
| 4,873,655 | 10/1989 | Kondraske . |
| 4,949,274 | 8/1990 | Hollander et al. . |
| 4,963,820 | * 10/1990 | Medlin ................................ 324/142 |
| 5,050,106 | 9/1991 | Yomamoto et al. . |
| 5,089,979 | 2/1992 | McEachern et al. . |
| 5,162,725 | * 11/1992 | Hodson et al. ...................... 324/115 |
| 5,248,933 | 9/1993 | Ventitti . |
| 5,546,082 | 8/1996 | LaRocca et al. . |
| 5,691,635 | 11/1997 | Pot et al. . |
| 5,703,324 | 12/1997 | Harder . |
| 5,939,875 | * 8/1999 | Felps et al. .......................... 324/115 |

* cited by examiner

Primary Examiner—Safet Metjahic
Assistant Examiner—Anjan K Deb
(74) Attorney, Agent, or Firm—Finnegan, Henderson, Farabow, Garrett & Dunner, L.L.P.

(57) ABSTRACT

An electronic accessory assembly to be used with a host electronic instrument provides previously recorded data from a non-volatile memory as to the accessory's operational capabilities. This memory is accessed by a host device either when the host device is powered up, or when an new accessory is connected to the host device. The host device then uses this information along with the operational requirements of the user to set the operational parameters of the accessory/host combination to optimally perform the functions required by the user.

20 Claims, 9 Drawing Sheets

FIG. 4

| ACCESSORY/HOST SETTING | HOST SETTING | ACCESSORY ATTENUATION | ACCESSORY GAIN | ACCESSORY TOTAL GAIN** | DATA 1X | DATA 10X | GAIN 3 | GAIN 2 | GAIN 1 | GAIN 0 | ATT 1 | ATT 0 |
|---|---|---|---|---|---|---|---|---|---|---|---|---|
| 100mV | 100mV | ÷1 | X10 | 10 | STROBE* | HOLD | 0 | 0 | 0 | 1 | 0 | 1 |
| 200mV | 100mV | ÷1 | X5 | 5 | STROBE | HOLD | 0 | 0 | 1 | 0 | 0 | 1 |
| 500mV | 100mV | ÷1 | X2 | 2 | STROBE | HOLD | 0 | 0 | 1 | 1 | 0 | 1 |
| 1V | 200mV | ÷1 | X2 | 2 | STROBE | HOLD | 0 | 1 | 0 | 0 | 0 | 1 |
| 2V | 200mV | ÷1 | X1 | 1 | STROBE | HOLD | 0 | 1 | 0 | 1 | 0 | 1 |
| 5V | 200mV | ÷1 | X.4 | .4 | STROBE | HOLD | 0 | 1 | 1 | 0 | 0 | 1 |
| 10V | 200mV | ÷10 | X2 | .2 | HOLD | STROBE | 0 | 1 | 0 | 1 | 0 | 0 |
| 20V | 200mV | ÷10 | X1 | .1 | HOLD | STROBE | 0 | 1 | 1 | 0 | 0 | 0 |
| 50V | 200mV | ÷10 | X.4 | .04 | HOLD | STROBE | 0 | 1 | 1 | 1 | 0 | 0 |
| 100V | 200mV | ÷100 | X2 | .02 | HOLD | STROBE | 0 | 0 | 0 | 1 | 1 | 0 |
| 200V | 200mV | ÷100 | X1 | .01 | HOLD | STROBE | 0 | 0 | 1 | 0 | 1 | 0 |
| 500V | 200mV | ÷100 | X.4 | .004 | HOLD | STROBE | 0 | 0 | 1 | 1 | 1 | 0 |
| 1000V | 200mV | ÷100 | X.2 | .002 | STROBE | STROBE | 1 | 1 | 0 | 1 | 1 | 0 |

(Columns DATA 1X and DATA 10X are under ATTENUATION SETTING SEQ.; GAIN 3–GAIN 0 under GAIN SETTING SEQ.; ATT 1, ATT 0 under ATTENUATION SETTING SEQ.)

\* STROBE REFERS TO SETTING THE BIT TO LOW (0) AND THEN CHANGING IT TO HIGH (1).

\*\* TOTAL GAIN REFERS TO THE MULTIPLICATIVE FACTOR SHOWING THE RESULTING CHANGE IN SIGNAL LEVEL RESULTING FROM THE SIGNAL'S PASSAGE THROUGH THE SIGNAL PATH OF THE ACCESSORY. SEPARATE GAIN/ATTENUATION OCCURS AT THE TIP OF THE PROBE AND FOR CERTAIN SETTINGS ALSO WITHIN THE HOST ITSELF.

FIG. 6

| BANDWIDTH | BW1 | BW0 |
|---|---|---|
| 20MHz | L | L |
| 150MHz | L | H |
| FULL | H | L |

FIG. 5

| COUPLING | DATA AC* | DATA DC* |
|---|---|---|
| DC | HOLD | STROBE |
| AC | STROBE | HOLD |

*NAMES OF THE BIT REGISTERS

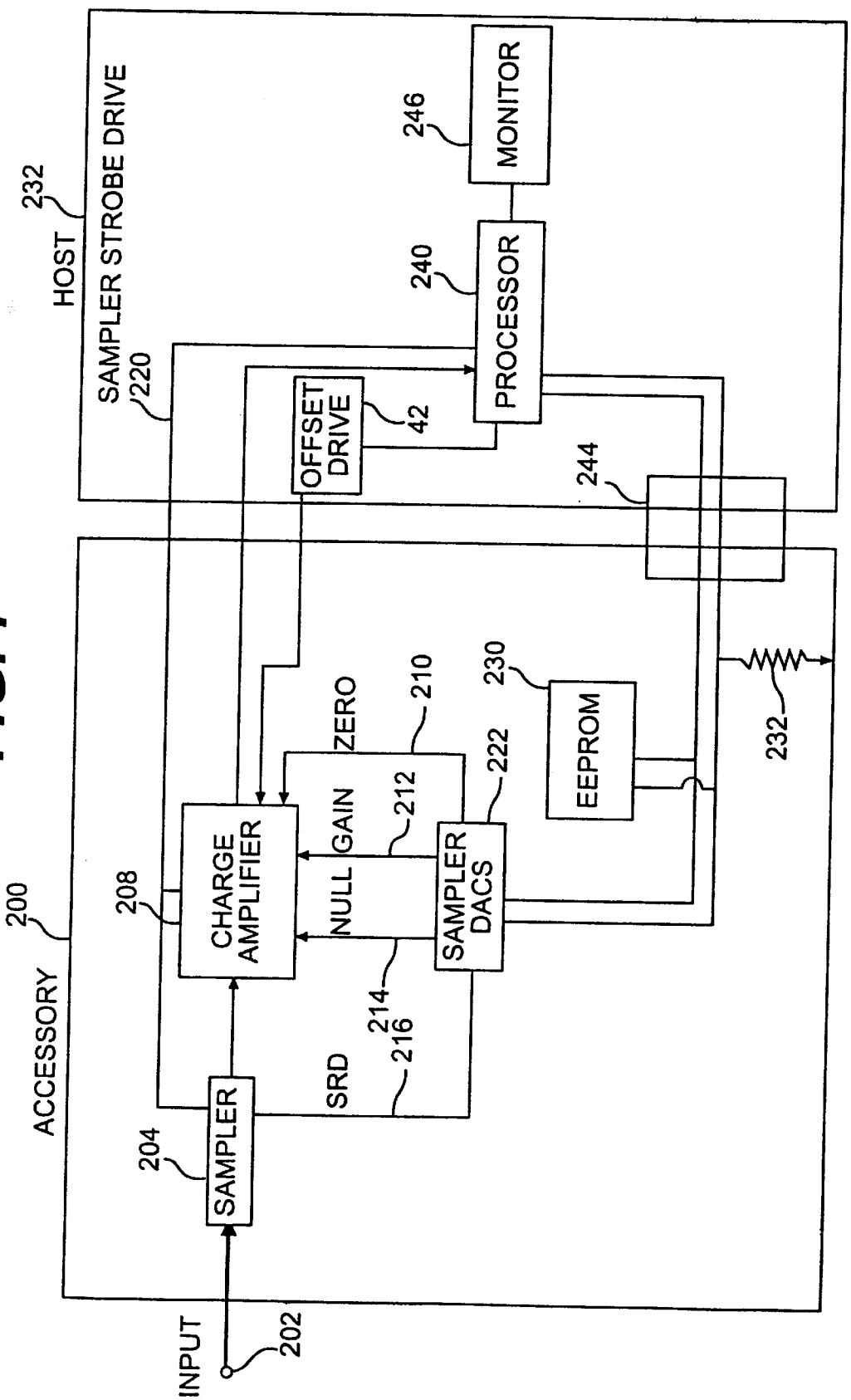

ACCESSORY WITH INTERNAL ADJUSTMENTS CONTROLLED BY HOST

I. BACKGROUND OF THE INVENTION

The present invention relates to an accessory, such as a probe, with internal adjustments controlled by a host, such as an oscilloscope.

Conventional testing and measuring equipment for electronic devices comprise signal acquisition accessories, such as a probe, attached to a host device, such as an oscilloscope. The host translates, displays and interprets the input from the accessory. An accessory, such as a probe, may be used for a variety of purposes and therefore preferably has variable capacities, such as threshold voltages, input coupling, bandwidth, attenuation factor, input resistance and/or capacitance.

While some accessories have set configurations, others may have several internal configurations that are switch-selectable. Some accessories store certain information, such as accessory identification and capacities, in the accessory and communicate the stored information between the accessory and the host device. U.S. Pat. No. 4,672,306, the disclosure of which is expressly incorporated herein by reference, issued on Jun. 9, 1987 to Thong, for example, describes equipping a probe with a non-volatile memory device, reading this memory from an attached oscilloscope through a serial communications interface, and conveying the information stored in the probe's memory to the oscilloscope at power-up of the oscilloscope or attachment of the probe.

Accessories, such as probes, may also have separate attachments, such as head, cable, and termination units, that must be calibrated to obtain specific measurements.

Because testing and measurement devices often measure subtle differences in an environment, accuracy of the measurement is extremely important. To increase the accuracy of the measurement, each combination of an accessory and a host device must be properly configured before it can be used. Accessories that are not properly calibrated, compensated, or otherwise appropriately configured may introduce substantial error into the measurements. Proper configuration, however, can be a complex and time-consuming process. Such complexity may derive not only from the selection process itself, but also from the need to maintain records of the information necessary to make that selection correctly.

II. SUMMARY OF THE INVENTION

An object of the present invention is to provide a method and system for communicating between the accessory and the host device that allow additional apparatus to be included in the accessory closer to the signal input, rather than in the host device.

Another object of the present invention is to provide a method and system that allow for accommodation of variances resulting from the connecting of a particular accessory with its own operating characteristics to a host.

The present invention has a further objective of providing a method and systems for allowing the selection of signal bandwidth in the accessory, for allowing the selecting of the AC/DC coupling of the accessory in the host device, for allowing the selecting of total attenuation across the signal path through the accessory in the host device, and for allowing the signal level range to be selected by the host in accordance with the capabilities of the accessory.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a host and detachable accessory test equipment combination wherein the accessory includes a test signal input, a test signal output, a variable circuit element associated with a signal path between said input and output, and memory wherein data related to operation of the accessory is stored; and the host includes a processor programmed to vary the accessory circuit element, the host and accessory having a common communication path to achieve that variation.

The variable circuit element associated with the signal path between the input and output of the accessory includes one or more of: a variable gain element in the path, a variable attenuator in said path, a switch to provide ac/dc coupling in said path, a variable analog circuit coupled to said path to inject a signal into said path, a variable low pass filter in said path, and a variable gain element coupled to said accessory output.

The host includes a processor within which is stored a decision algorithm, the decision algorithm having the capacity to set the host and accessory gain and attenuation elements. This setting is chosen to maximize a desired signal range input by the user of said host and detachable accessory test equipment combination.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

III. BRIEF DESCRIPTION OF THE DRAWINGS

FIG. 4 shows a table relating example operational settings to command sequences.

FIG. 5 shows a table relating example DC/AC couplings to command sequences.

FIG. 6 shows a table relating example bandwidth settings to command sequences.

FIG. 7 shows in block diagram form a third embodiment of the invention.

IV. DETAILED DESCRIPTION

Reference will now be made in detail to the present preferred embodiments of the invention, examples of which are illustrated in the accompanying drawings. Wherever possible, the same reference numbers will be used throughout the drawings to refer to the same or like parts.

Figure 1:
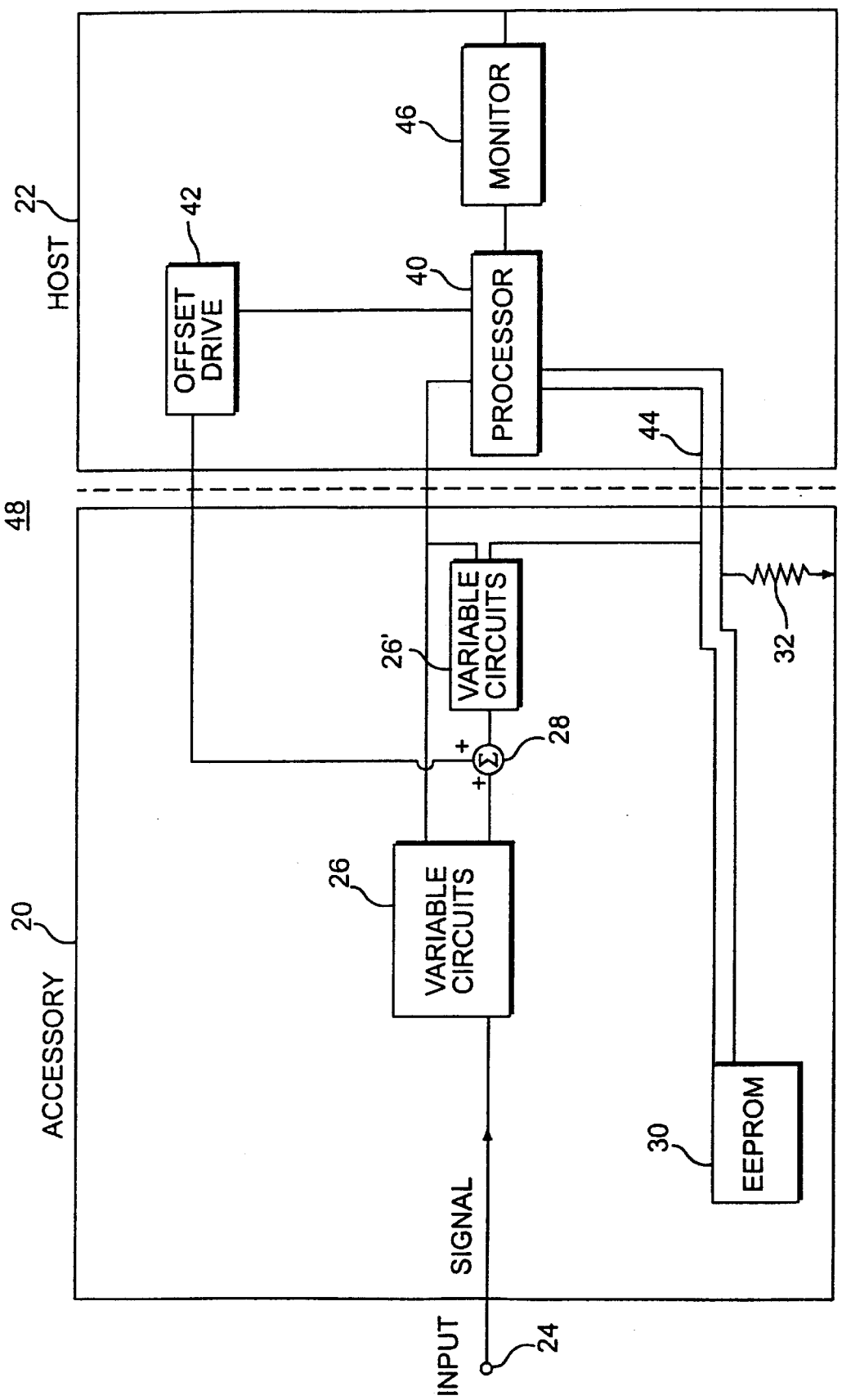
FIG. 1 shows in block diagram form a first embodiment of the invention.

Methods and systems consistent with the present invention may be implemented using an accessory and host model as shown in FIG. 1. FIG. 1 shows an accessory 20 and host 22. Accessory 20 is shown in FIG. 1 as including an input 24, variable circuit: 26, and variable circuit 26', offset injector 28, EEPROM 30, and signaling resistor 32. Host 22 is shown in FIG. 1 as including processor 40, offset drive 42, serial communications interface 44, and monitor 46.

Accessory 20 of FIG. 1 has an input 24 which is connected along a signal path to variable circuits 26. Variable circuits 26 have an output to offset injector 28, which is connected to the input of variable circuits 26'. Variable circuits 26' send output to processor 40 of host 22. Processor 40 is connected to monitor 46, offset drive 42 and serial communications interface 44, all of host 22. Offset drive 42 is connected to offset injector 28 of accessory 20. Serial communications interface 44 is connected to both EEPROM 30 and signaling resistor 32 of accessory 20.

When a connection is made between accessory 20 and host 22 over serial communications interface 44, host 22 detects that signaling resistor 32 is present and this serves as a signal to host 22 that an accessory of the type containing read only memory has been attached. Once host 22 becomes aware of accessory 20, host 22 accesses non-volatile memory 30 of accessory 20, shown in FIG. 1 as an electrically erasable programmable read only memory (EEPROM), over serial communications interface 44. Serial communications interface 44 thus forms a communication interface between accessory 20 and host 22. Non-volatile memory 30 can take the form of read-only memory (ROM) or programmable read-only-memory (PROM). Non-volatile memory 30 may be programmed at the time of manufacture of accessory 20 with a predetermined set of data or memory 30 may receive data from host 22.

The information in memory 30 discloses to host 22 the characteristics of accessory 20, some of which can be set by host 22. These characteristics might include, for example, selectable gain settings, selectable attenuation settings, selectable bandwidth limits, and selectable AC/DC coupling. Memory 30 is intended to be read once by host 22 when the host 22 is powered up or when accessory 20 is attached, and the remainder of the time, serial communications interface 44 is used for other purposes such as sending commands from host 22 to accessory 20.

Alternatively, accessory 20 may also communicate at will with host 22. Accessory 20 may signal host 22 that certain information, for example information indicating that a switch on accessory 20 has been altered, has become available. This signal would instruct host 22 to access this information from accessory 20. The communication may be accomplished, for example, by an analog resistive code sequence, such as a drop in the value of signaling resistor 32, that is distinguishable from the attachment signal. Non-volatile memory 30, which host 22 has accessed, includes information instructing host 22 as to the condition of accessory 20 that would bring about a certain code from accessory 20. This information could also include the desired response of host 22 upon receiving a given code. The desired response might be, for example, to notify the user that, as given in the example above, a switch has been altered and to offer a chance to reset the signal path in response thereto.

Returning to the information that has been stored in non-volatile memory 30 of accessory 20, this information instructs host 22 as to the capabilities of accessory 20. Host 22 uses this information to set the values of certain components of accessory/host combination 48 to comply with the requirements of the user. These requirements can be accepted into the system either as the pre-existing settings of host 22 before accessory 20 was attached or could be input anew by the user as requirements change. Once host 22 decides the specific settings necessary to carry out the requirements of the user, host 22 can both change the internal settings of host 22, and also send a signal to accessory 20 to change the settings of accessory 20 to meet the current requirements.

Upon receiving the information from the memory 30 of accessory 20, host 22 builds a software model of accessory 20. Host 22 can then proceed by either building a table of the selected settings using the model of accessory 20, or can input these new settings as variables within an algorithm in processor 40 of host 22.

Figure 2:
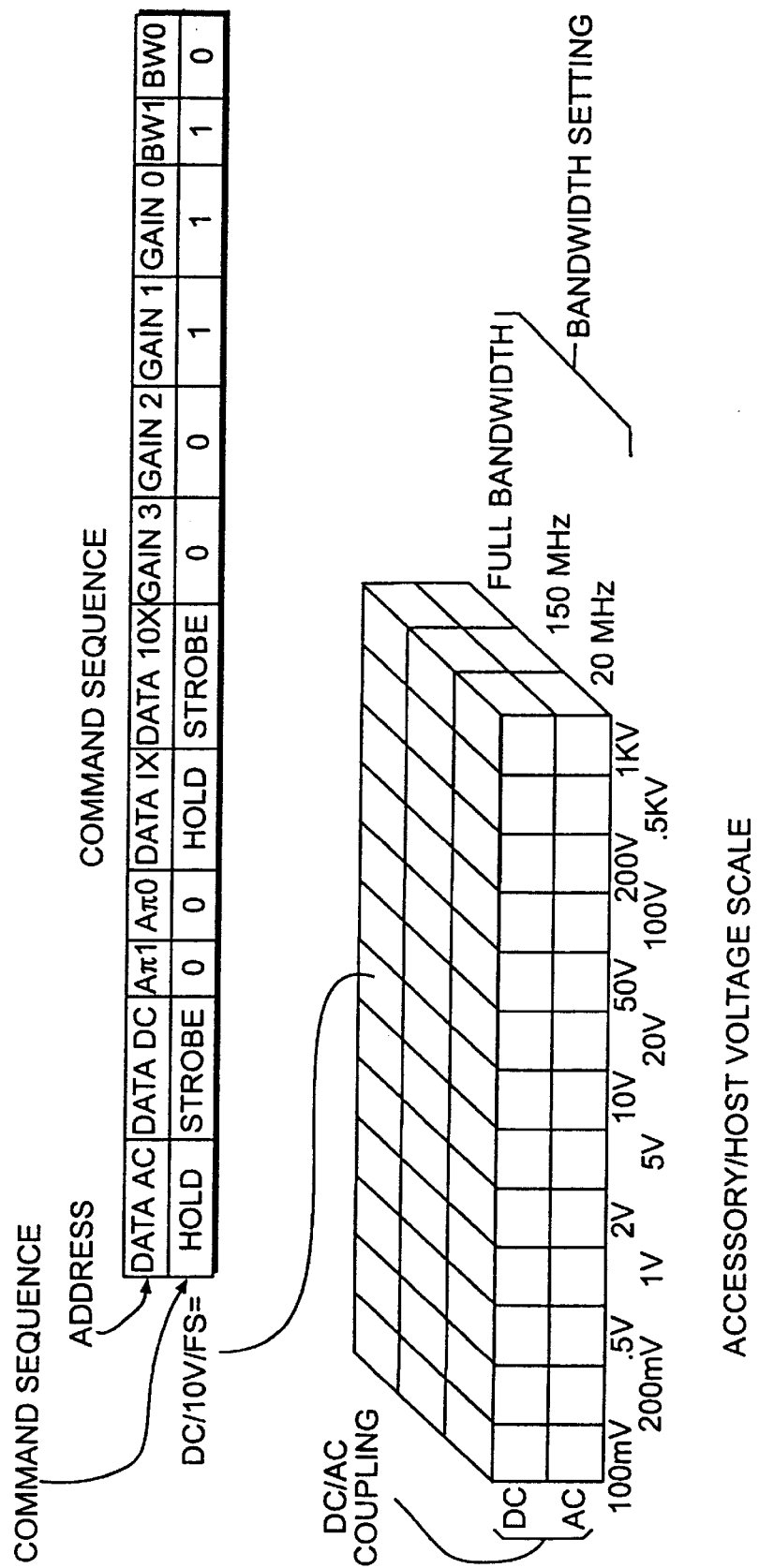
FIG. 2 shows a table of look up values relating to operational settings one embodiment of the invention.

In the case of the table format, host 22 creates a table with a number of dimensions equal to the number of variables which are to be changed by host 22. Where there are redundant settings for a certain variable, only those settings which optimize the system's function for that variable will be placed in the table. Host 22 learns this number of variables and the available range of settings for each of these variables in the information which is downloaded by host 22 from memory 30. The optimization values might be found in memory 30, in host 22, or optionally might be calculated by host 22. FIG. 2 shows an example of such a table, where the three dimensional table includes as its axes: (bandwidth)×(AC/DC coupling)×(accessory/host voltage scale). The requirements of the user would select a value for each of the variables in the table. Where, as in voltage scale above, the needs of the user may not fall evenly on one of the predefined values, the system selects the next highest value (though in certain configurations the next lowest may be desirable) as the correct requirement.

Each entry in the table has associated with it a certain sequence of commands that might be, for example, values or sequences of values, each value or sequence associated with the addresses to which they are to be sent. FIG. 4 shows an example of eight bits of such a command sequence in columns 6–13. The term strobe used in the table refers to a well known method of activating a certain type of switch, called a latching relay, by first sending a low signal and then sending a high signal to the same circuit element. Accessory/host setting is the maximum signal range which is to be input at accessory 20 for each given setting. Host setting is the maximum signal range which is to be input into host 22 for a given setting, as host 22 can internally change the signal strength of an incident signal. Accessory attenuation, accessory gain and accessory total gain refer to the attenuation in the attenuators, the gain in the amplifiers and the total gain across the signal path of accessory 20.

Once the sequence of commands has been selected, it is transmitted into accessory 20, where it sets the components of accessory 20 to the desired settings.

A second option in selecting the command sequence to be output by host 22 is to use an algorithm to replace the table described above. The algorithm would function by taking in the user's requirements and then trying to match those requirements to the set range of characteristics which host 22 has accessed from memory 30. Such an algorithm is well known in the art of instrument construction, where the instrument uses such an algorithm to modify an incoming signal by changing the signal path along which the incoming signal travels. The distinction is that the variables of the algorithm in this invention are not set to conform only to the components of host 22 device, but are instead input from an external accessory, and incorporated into the algorithm. This algorithm can therefore set the host/accessory combination as a unit, where in effect, host 22 has incorporated accessory 20 and its functions into its own system.

Both the table and algorithm methods described above output the same message to accessory 20. This message acts to activate or deactivate certain circuits in accessory 20, thereby changing the configuration of accessory 20 to meet the requirements of the user.

Figure 3:
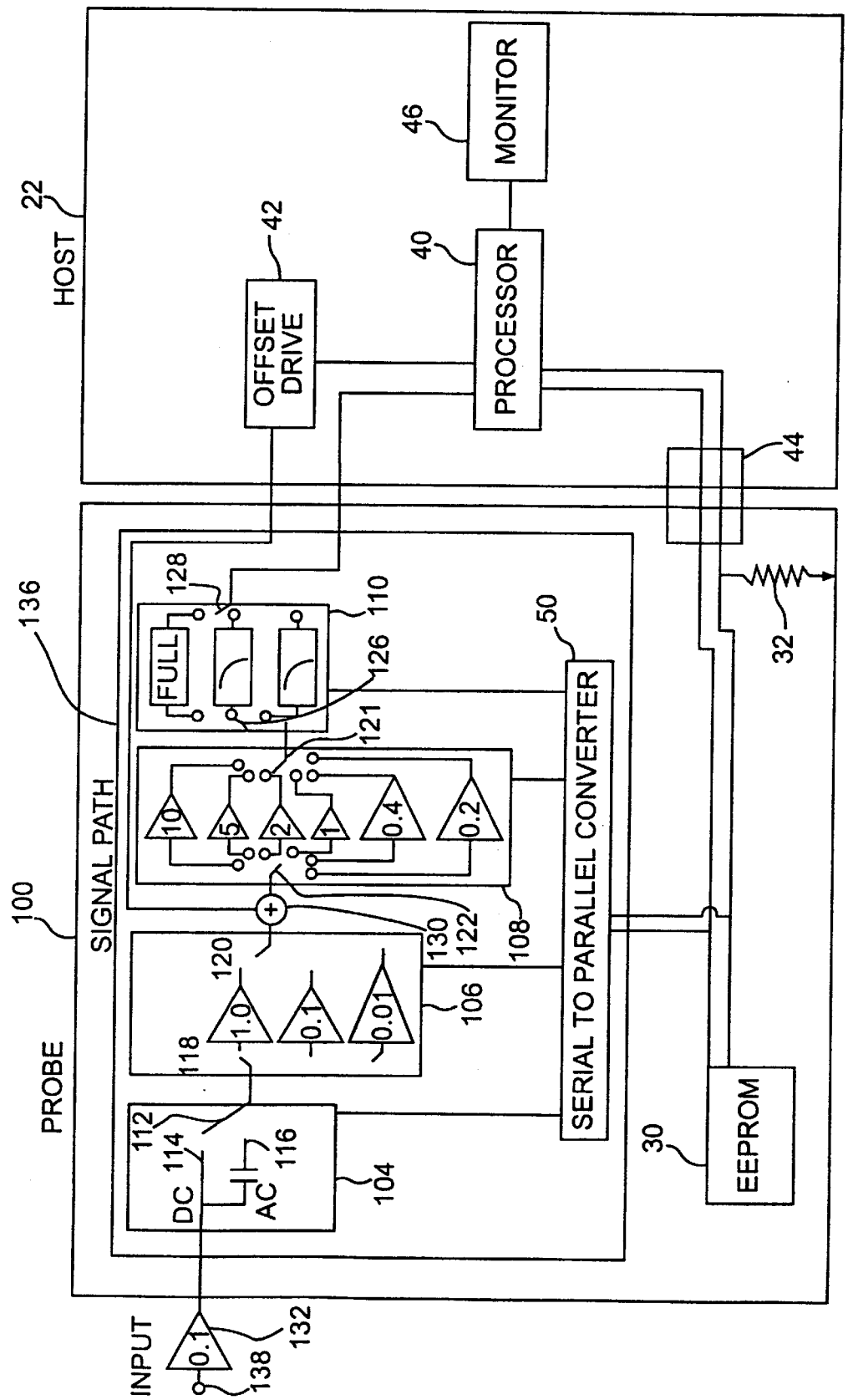
FIG. 3 shows in block diagram form a second embodiment of the invention.

FIG. 3 shows one embodiment of an accessory consistent with the present invention. The accessory takes the form of probe 100, having input (tip) 138, input attenuator 132, signal path 136, output 134, and memory 30. Signal path 136 consists of DC/AC coupling selection circuit 104, attenuation selection circuit 106, offset injector 130, gain selection circuit 108, bandwidth selection circuit 110, and switches 112, 118, 120, 122, 124, 126, and 128. Host 22 has serial communications interface 44.

Probe 100 of FIG. 3 has input (tip) 138 connected to input attenuator 132. Input attenuator 132 is connected to signal path 136, which ends at output 134. Within signal path 136 are DC/AC coupling selection circuit 104 which is connected to attenuation selection circuit 106 by switches 112 and 118. Attenuation selection circuit is connected to offset injector 130 by switch 120. Offset injector 130 is connected to gain selection circuit 108 by switch 122. Gain selection circuit 108 is connected to bandwidth selection circuit 110 by switches 124 and 126. Bandwidth selection circuit 110 connects to output 134. Memory 30 of probe 100 is connected to host 44 by serial communications interface 44.

As described above, upon turning on the system, or upon connecting probe 100 to host 22, information regarding all of the settings for each of the selection circuits given above is downloaded into host 22. Utilizing the specific requirements of the system as defined either by having the user input his or her current needs or by relating back to the settings before probe 100 was attached, the system decides the necessary configuration of probe/host combination 140. The part of the configuration which is to be sent to probe 100 is translated into a predefined command sequence, for example a sixteen bit binary sequence, of which some, but not necessarily all of the bits are used.

The first selection circuit of the signal path 136 is DC/AC coupling selection circuit 104. FIG. 5 shows the two bits, DATAAC and DATADC (bit register names), of the sixteen bit sequence that are used to select the appropriate DC/AC coupling. These two bits are sent as a signal to switch 112 to create a connection along either DC path 114 or AC path 116. Switches of many different types are known in the art, and so the functioning of the switches to be used in probe 100 will not be described herein.

Next will be described the combined setting of attenuation selection circuit 106 and gain selection circuit 108. In the case of DC/AC coupling selection circuit 104 discussed above, there are only two options, either DC or AC coupling which is selected by the user. In the case of attenuation and gain, these two must be selected together in order to raise or lower the incoming signal to a range which can be read by host 22. If for example, host 22 is able to read a range of signals from −100 mV to 100 mV, it becomes necessary for probe 100 to scale the incoming signal such that the incoming signal is sent out to host 22 in the correct range, but also such that the attenuation/gain setting chosen optimizes this range. In order to calculate the total attenuation of the signal after having passed through both the attenuation selection circuit 106 and gain selection circuit 108, the gain is multiplied by the attenuation.

The attenuation selection circuit 106 has three possible settings, 1.0, 0.1, and 0.01 which relate to the factor by which the incoming signal is multiplied to find its level of attenuation. The three settings physically relate to three separate paths across the attenuation selection circuit, the paths having been selected by four bits of the sixteen bit command sequence. The four bits act together, bits DATA1X and DATA10X on switch 118, and bits Att1 and Att0 on switch 120 in order to connect the correct attenuation into signal path 136.

The gain selection circuit 108 acts in a similar fashion to attenuation selection circuit 106, with six different levels of gain which can be connected into signal path 136. Again, a four bit command sequence, Gain3–Gain0 of FIG. 4, is used to program the switches 122 and 124 which act to connect the selected gain into signal path 136.

As is clear from multiplying the different levels of gain, listed under Accessory Gain of FIG. 4, by the different levels of attenuation, listed under Accessory Attenuation of FIG. 4, more than one combination results in the same total gain. The system can, however, find the optimum combination of gain and attenuation for any given level of total attenuation from information that can be stored in non-volatile memory 30 of probe 100, in host 22, or from calculations performed by host 22. It will then match the selected readout range chosen by the user to that level of total attenuation which will maximize that signal output range. Having decided which combination is correct, host 22 will then translate that setting into eight bits of the sixteen bit command sequence described above (four bits for attenuation and four for gain) and will send those signals to the proper switches, 118, 120, 122, and 124 inside probe 100.

In this embodiment, located between attenuation selection circuit 106 and gain selection circuit 108 is offset injector 130, which acts to inject an outside signal created by offset driver 42 of host 22 into the signal path 106. This well known method shifts the level of the entire signal before the signal reaches host 22.

Finally, probe 100 includes a bandwidth selection circuit 110 which selects among three different bandwidths 20 MHz, 150 MHz and full bandwidth, by choosing one of two low pass filters or one direct connection. As with the DC/AC coupling discussed above, the filter which is included in signal path 136 in order to limit the signal to a user selected bandwidth is related directly to the needs of the user. The selection of a specific bandwidth will be translated into a two bit command sequence, as shown in FIG. 6, that is then sent to switches 126 and 128 of bandwidth selection circuit 110 in order to connect the selected low pass filter or direct connection into signal path 136. In the preferred embodiment, bandwidth selection circuit 136 does not effect the gain of the signal to an extent which would have to be accounted for by host 22. Use of other well known bandwidth selectors might have a more significant effect on the signal gain, and would therefore have to be included in the calculation and selection of total attenuation.

FIG. 7 shows another embodiment consistent with the present invention including accessory 200 and host 232. Accessory 200 includes input 202, sampler 204, charge amplifier 208, sampler DACs 222, and memory 230. Host 232 has processor 240, monitor 246 and serial communications interface (SCI) 244. SRD 216, null 214, gain 212, zero 210, and sampler strobe drive 220 refer to the wires that carry the signals of the same names.

Within accessory 200, input 202 is connected to sampler 204. Sampler strobe drive 220 connects sampler 204, charge amplifier 208 and processor 240. Sampler DACs 222 are connected by zero 210, gain 212, and null 214 to charge amplifier 208, by SRD to sampler 204. SCI 244 connects processor 240, memory 230 and sampler DACs 222.

A signal input to accessory 200 will periodically be sampled by sampler 204 according to a signal sent by sampler strobe drive 220. The time at which sampler 2C4 will sample a signal is controlled by sampler strobe drive 220. Parameter SRD 216, controlled by sample DAC 222, alters the shape of the signal from sampler strobe drive 220 by shortening the rise time of the signal. This allows the sampler 204 to be adjusted to collect a sample of the signal from input 202 for optimum performace.

Null 214 and zero 210 are two signals output by sampler DACs 222 that act as a fine adjust to the offset level. This adjustment is called offset offset. This adjustment is required because even when zero signal is incident at input 202, host 232 will not read exactly zero signal. Offset offset therefore accounts for the small changes away from zero offset that occur inside accessory 200.

Gain 212 is a further signal from sampler DACs 222 which is used to set the gain level of charge amplifier 208.

Sampler DACs 222 are controlled by processor 240 across serial communications interface 244 through SCI 244. Processor 240 need not contain the entire set of information necessary to control the functioning of accessory 200 when it is not in contact with accessory 200. Upon either powering up, or attachment of accessory 200, host 232 will search for memory 230 of accessory 200. Contained in memory 230 is information that teaches host 232 the operating characteristics of accessory 200 such that host 232 following reception of the information will then be able to control accessory 200. Sampler DACs 222 pass much of the control signals to operating components of accessory 200. These DACs operate by reading in a digital signal from host 232, converting those signals to analog signals, and then passing them on through the corresponding wire, SRD 216, null 214, gain 212 or zero 210. In essence, each new accessory is able to teach any host of the correct type, both what that accessory can do, and also how to program the accessory to perform any of those functions.

Describing now the preferred operational characteristics of the embodiment of FIG. 7, accessory 200 is a 43.75 ps (GHz) acquisition only sampler with a 1 Vpp dynamic range, and a 1.1 V offset. The assertion of a strobe signal from sampler strobe drive 220 causes a sampling bridge to be turned on at sampler 204 for a very narrow aperture; at the same time, charge amplifier 208 is gated on to initiate an integration cycle for the charge trapped on the sampling bridge of sampler 208. There are two modes of operation intended for sampler 204, namely open loop, and DESFL. For open loop mode, the programmed offset from offset drive 42 will be set up on the offset drive analog line to charge amplifier 208, and the sampled output from sampler 208 will be incremented to this offset voltage. For DESFL, intended for non-random signals, host 232 will program offset drive 42 with the expected value of the sample to be taken at sampler 204, and the sampled output will be incremental to this expected value. Accessory 200 won't know the difference in the hardware setup; it is entirely up to the methodology of how host 232 sets up offset drive 42.

Figure 8:
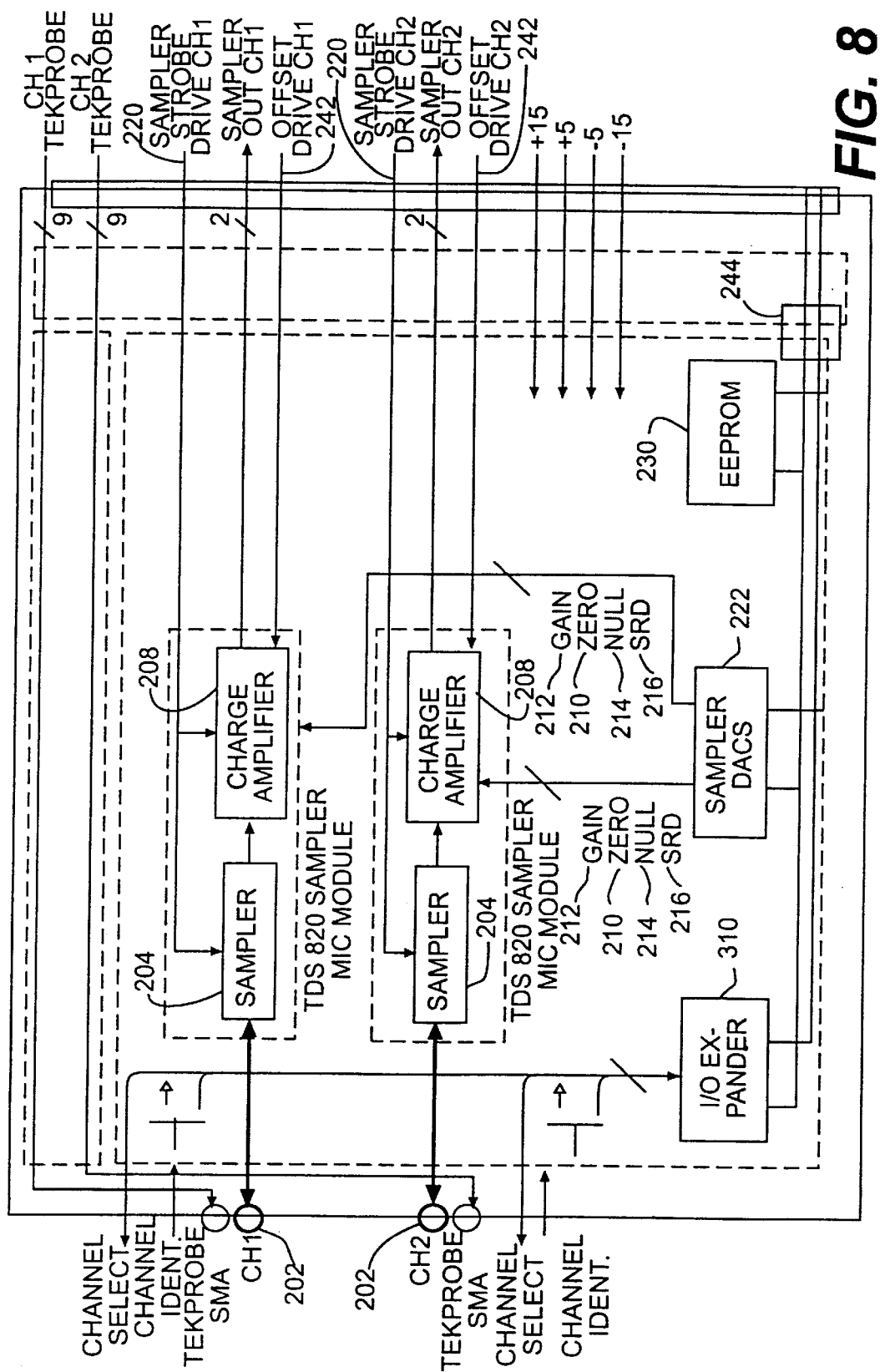
FIG. 8 shows in block diagram form a fourth embodiment of the invention.

FIG. 8 shows a further preferred embodiment of the invention in which multiple samplers are used with multiple sampler channels. The functions and reference numbers of the elements of FIG. 8 correspond to the similar elements of FIG. 7.

Figure 9:
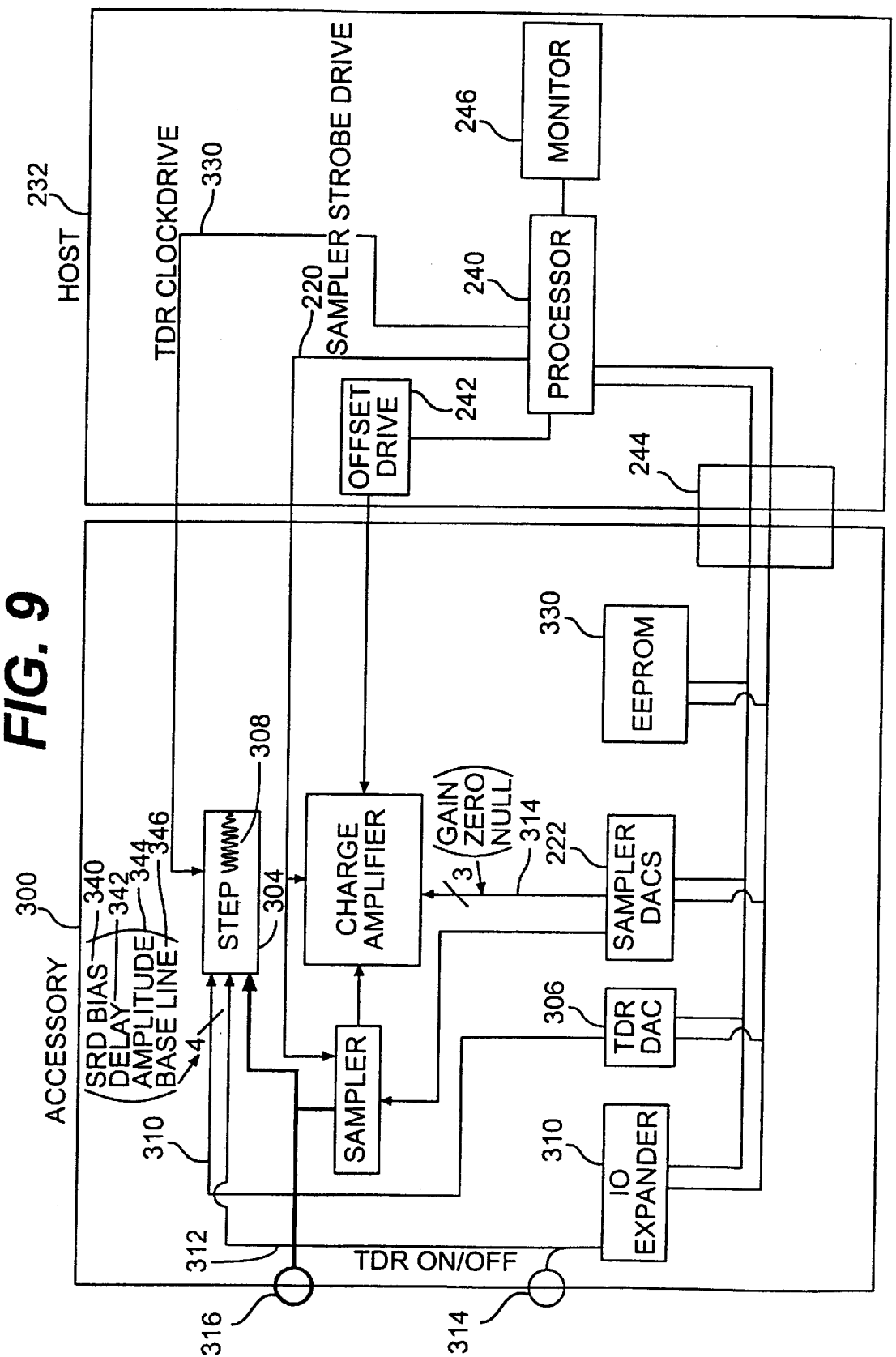
FIG. 9 shows in block diagram form a fifth emodiment of the invention.

FIG. 9 shows an alternative embodiment of an accessory consistent with the present invention. Accessory 300 is similar to accessory 200 in FIG. 7 and like elements are shown with identical numbers in both figures. Instead of showing null 214, gain 212 and zero 210 separately, they have been combined into one element 314 in FIG. 9. Accessory 310 of FIG. 8 further includes IO expander 310, TDR DAC 306, TDR clock drive 330, step 304, step resistor 308, TDR on/off 312, TDR on/off button 314, and four wires each carrying one of SRD bias 340, delay 342, amplitude 344, and base line 346 drawn as a combined four wire 310.

The elements which have been added to the configuration of FIG. 7 are step 304 with its associated step resister 308, which is connected to IO expander 310, TDR clock drive 330, and TDR DAC 306. TDR clock drive is connected to processor 240 of host 232. IO expander 310 and TDR DAC 306 are linked to SCI 244.

The function which has been added to this embodiment is Time Domain Reflectometry (TDR). This process involves creating a signal at step 304, sending it out through port 316, and reading any reflected signal back in through port 316. The reflected signal discloses the nature of the fault, and by recording the time that it has taken to travel to and reflect from a fault, host 232 can determine at what distance from accessory 300 the fault occurred.

Describing now the functional elements of the circuit which drives the Time Domain Reflectomety process, TDR clock drive 330 is a clock signal sent to step 308 which initiates a TDR signal from step 308. One of four wires 310 carries SRD bias 340 which allows step 308 to emit a signal at a faster rate than can be accomplished by TDR clock drive 330 alone. This is accomplished by decreasing the rise time of the signal from TDR clock drive 330. Step 308 also includes a step termination resistance 308 which ensures that the reflected signal does not travel back through step 304. Step 308 also includes an input, TDR on/off 312, from IO expander 310. TDR on/off 312 is triggered by SCI 244. This method of deactivating the TDR circuit is necessitated by the signal from TDR clock drive 330, which operates constantly.

Figure 10:
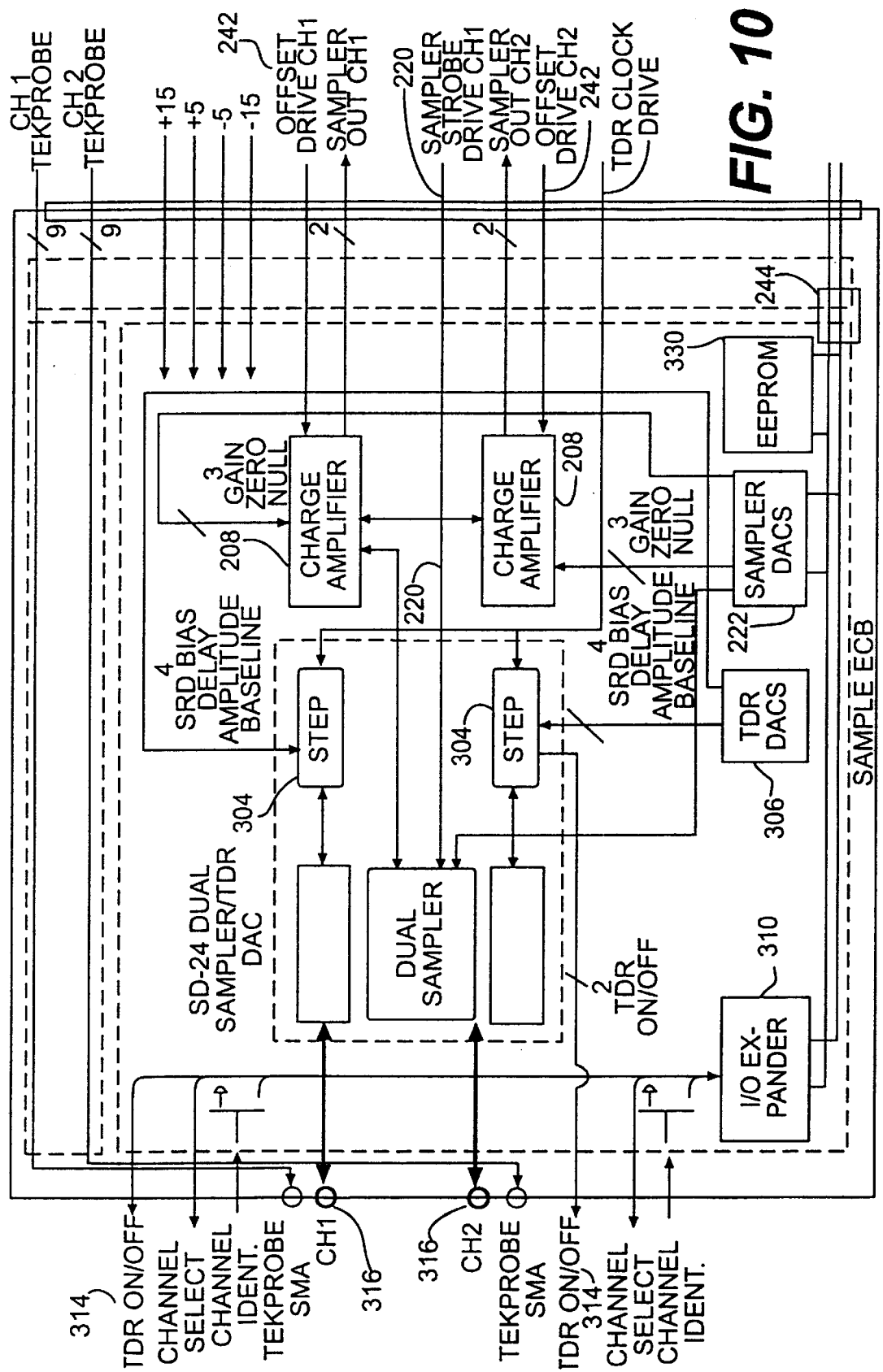
FIG. 10 shows in block diagram form a sixth embodiment of the invention.

TDR DAC 306 sends four wires 310 to step 304. One of four wires 310 is SRD bias 340, which carries an SRD bias signal, as explained above. Another of four wires 310 is delay 324, which carries a signal to delay the emission of a signal from step 304. This could be used, for example, to set in phase multiple TDR circuits, as shown in FIG. 10 described below. Another of four wires 310 is amplitude 344, which carries a signal to set the amplitude of the TDR signal. The final of four wires 310 is base line 346, which carries a base line correction for the TDR signal.

Sampler DACs 222 and TDR DAC 306 are controlled by processor 240 across serial communications interface 244. As with the embodiment shown in FIG. 7, processor 240 need not contain the entire set of information necessary to control the functioning of accessory 200 when it is not in contact with accessory 200. Upon either powering up, or attachment of accessory 200, host 232 will search for memory 230 of accessory 200. Contained in memory 230 is information that teaches host 232, the operating characteristics of accessory 200 such that host 232 following reception of the information, will then be able to control accessory 200. TDR DAC 306 and sampler DACs 222 function in the same manner as sampler DACs 222 of FIG. 7 described above.

FIG. 10 shows a further preferred embodiment of the invention in which multiple TDR circuits are used with multiple sampler channels. The functions and reference numbers of the elements of FIG. 10 correspond to the same elements of FIG. 9. Describing now the preferred operational characteristics of the embodiment of FIG. 10, accessory 300 is 17.5 ps (20 GHz) high resolution sampler. Accessory 300 has a 1 Vpp dynamic range and a 1.1 V offset. Each step 304 is an independent, polarity and baseline adjustable unit step generator approximately ±250 mV into 50Ω. The assertion of a clock signal on the TDR clock drive 330 causes the step 304 to switch from a current source to an off state, and maintain that state until TDR clock drive 330 initiates the reset (baseline current) state. The emission of TDR signals can be disabled and the unit forced into an open circuit state by digital control line (TDR on/off 312), in which case amplitude 344 is expected to be set to zero, and base line 346 set so that no DC current is injected into the output. Delay 342 is able to deskew approximately ±120 ps depending on the slew rate of the signal from TDR clock drive 330.

It will be apparent to those skilled in the art that various modifications and variations can be made in the implementation of the present invention and in construction of this accessory without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for measuring and testing electronic equipment comprising:
   an accessory comprising
      a signal path from a signal input to a signal output,
      variable circuit elements provided in the signal path, the variable circuit elements having variable electrical properties for modifying a signal received at the signal input, and
      a memory storing data related to a plurality of possible states of said variable circuit elements; and
   a host detachably coupled to the accessory the host comprising
      a host input coupled to the signal output of the accessory, and
      a processor programmed to generate and transmit command sequences to the detachable accessory to select a state of the plurality of states of the variable circuit elements of the accessory.

2. The apparatus of claim 1, wherein said variable circuit elements include a variable gain element.

3. The apparatus of claim 1, wherein said variable circuit elements include a variable attenuator.

4. The apparatus of claim 1, wherein said variable circuit elements include an ac/dc coupling switch.

5. The apparatus of claim 1, wherein said variable circuit elements include a variable analog circuit for injecting a signal into the signal path.

6. The apparatus of claim 1, wherein said variable circuit elements include a variable low pass filter.

7. The apparatus of claim 1, wherein said host further comprises a variable gain element coupled to the test signal output of the accessory.

8. The apparatus of claim 1, wherein the host further comprises at least one variable circuit element coupled to the host input.

9. The apparatus of claim 8, wherein said host further comprises a processor for setting the variable circuit elements of the accessory and the at least one variable circuit element of the host in order to maximize a desired signal range.

10. The apparatus of claim 9, wherein the variable circuit elements of the accessory includes a variable gain element and a variable attenuation element, and wherein the at least one variable circuit element of the host includes a variable gain element.

11. The apparatus of claim 1, wherein the host is an oscilloscope.

12. A method of modifying a detected signal received by a host/accessory combination, wherein the host includes at least one variable circuit element defining a host state and wherein the accessory includes at least one variable circuit element defining an accessory state, the method comprising the steps performed by the host of:
   detecting the presence of a memory in the accessory, the memory containing information about a set of possible accessory states;
   accessing the memory of the accessory;
   determining a set of desired signal characteristics;
   determining a host state and an accessory state that will modify the characteristics of the detected signal to correspond to the desired signal characteristics;
   setting the at least one variable circuit element of the host to the determined host state and the at least one variable circuit element of the accessory to the determined accessory state.

13. The method of claim 12, wherein the step of setting the at least one variable circuit element of the host and the at least one variable circuit element of the accessory includes maintaining the variable circuit elements in a previous state when the previous state is the same as the desired state.

14. The method of claim 12, wherein the step of determining a set of desired signal characteristics comprises receiving the set of desired signal characteristics from a user of the host/accessory combination.

15. The method of claim 12, wherein the desired signal characteristics include an AC/DC state.

16. The method of claim 12, wherein the desired signal characteristics include a desired signal voltage range.

17. The method of claim 12, wherein the desired signal characteristics include a desired bandwidth.

18. The method of claim 12, wherein the step of determining a host state and an accessory state includes building a table of possible host/accessory states using the information from the accessory memory and information about a set of possible host states.

19. The method of claim 18, wherein the step of determining a host state and an accessory state further includes matching the set of desired signal characteristics against the values in the table.

20. The method of claim 19, wherein the step of determining a host state and an accessory state further includes, when there are multiple host/accessory states in the table that match the set of desired signal characteristics, choosing a state of the multiple states that produces a best modified signal.

* * * * *